(12) United States Patent
Zhang

(10) Patent No.: US 11,979,126 B1
(45) Date of Patent: May 7, 2024

(54) PROGRAMMABLE GAIN AMPLIFIER WITH ACTIVE CHARGE-INJECTION/CHARGE-LEAKAGE SUPPRESSION

(71) Applicant: Gigajot Technology, Inc., Pasadena, CA (US)

(72) Inventor: Dexue Zhang, Arcadia, CA (US)

(73) Assignee: Gigajot Technology, Inc., Pasadena, CA (US)

(*) Notice: Subject to any disclaimer, the term of this patent is extended or adjusted under 35 U.S.C. 154(b) by 340 days.

(21) Appl. No.: 17/306,836

(22) Filed: May 3, 2021

Related U.S. Application Data

(60) Provisional application No. 63/019,953, filed on May 4, 2020.

(51) Int. Cl.
*H03F 3/45* (2006.01)
*H03G 3/30* (2006.01)

(52) U.S. Cl.
CPC .......... *H03G 3/30* (2013.01); *H03F 3/45475* (2013.01); *H03G 2201/103* (2013.01)

(58) Field of Classification Search
CPC ....................................... H03F 3/45

USPC .............................. 330/260, 51, 85
See application file for complete search history.

(56) References Cited

U.S. PATENT DOCUMENTS

| | | | |
|---|---|---|---|
| 4,404,525 A | 9/1983 | Amir et al. | |
| 5,796,300 A * | 8/1998 | Morgan | H03F 1/303 330/9 |
| 7,279,940 B1 | 10/2007 | Min | |
| 7,764,215 B2 | 7/2010 | Wan et al. | |
| 7,884,662 B1 * | 2/2011 | Chuang | G06F 3/044 327/554 |
| 8,134,401 B2 | 3/2012 | Hunter et al. | |
| 8,218,049 B2 | 7/2012 | Sakakibara | |
| 9,740,351 B2 * | 8/2017 | Li | G06F 3/016 |
| 9,942,496 B2 | 4/2018 | Ha et al. | |
| 11,031,949 B2 * | 6/2021 | García González et al. | H03M 3/34 |

* cited by examiner

*Primary Examiner* — Henry Choe
(74) *Attorney, Agent, or Firm* — Robert C. Kowert; Kowert, Hood, Munyon, Rankin & Goetzel, P.C.

(57) ABSTRACT

Charge leakage/injection suppression circuitry within a capacitive programmable gain amplifier provides a low-impedance expulsion path for residual carriers within a feedback-path amplifier-mode switch and equalizes a voltage across a critical-leakage-path component of that amplifier-mode switch, reducing charge injection and leakage into an otherwise isolated amplifier input node to yield a low-noise amplifier output.

22 Claims, 2 Drawing Sheets

*Active-Injection/Leakage-Suppression Capacitive Programmable-Gain Amplifier*

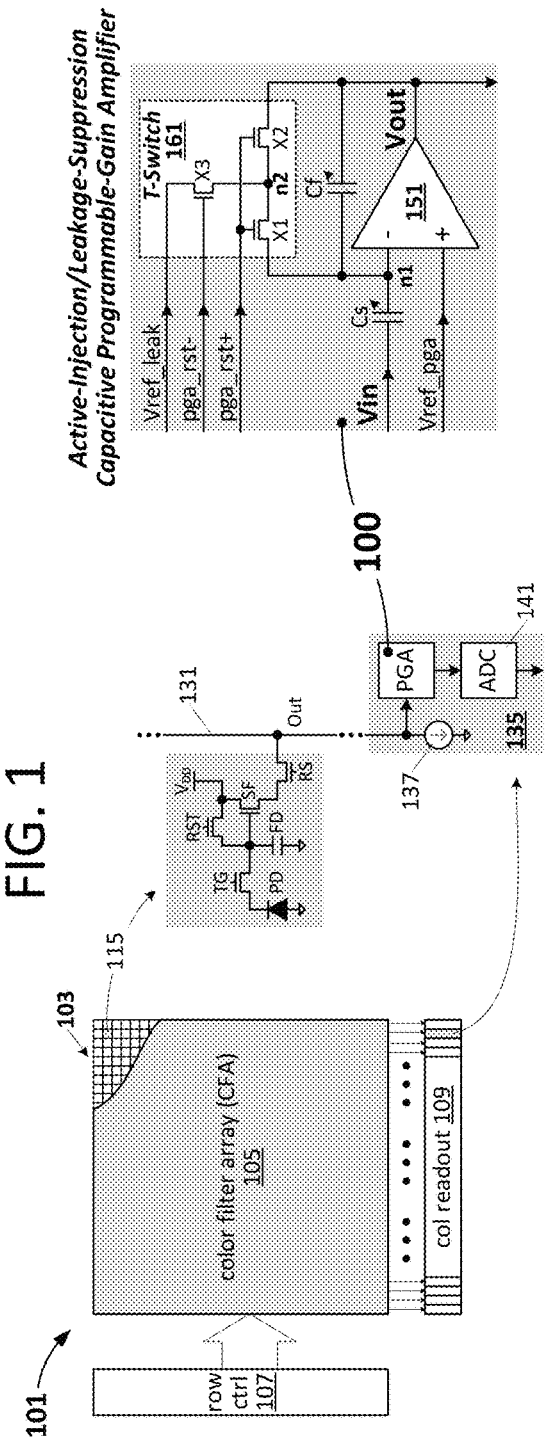
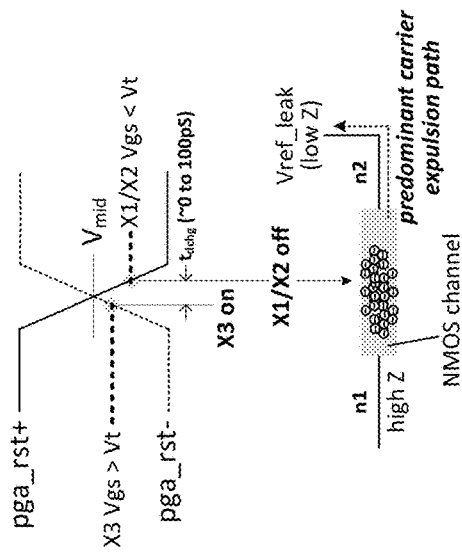
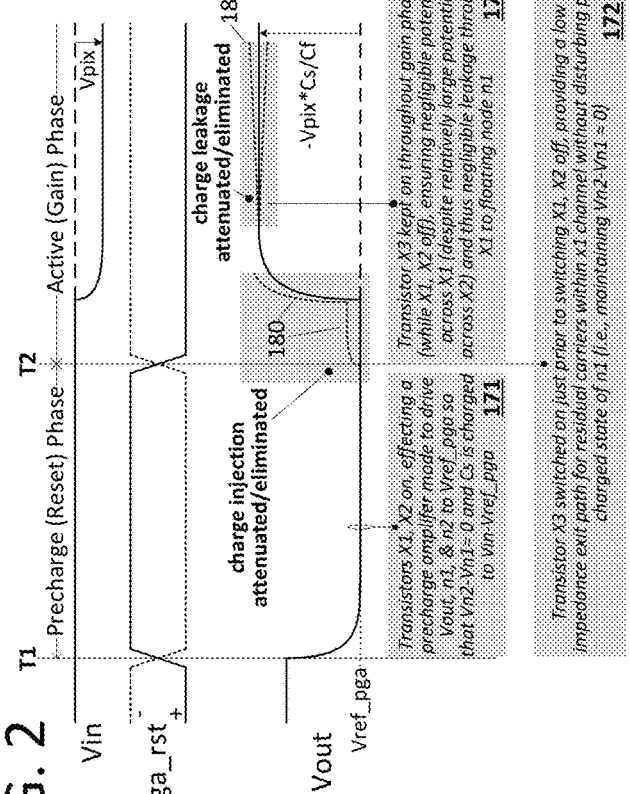

PROGRAMMABLE GAIN AMPLIFIER WITH ACTIVE CHARGE-INJECTION/CHARGE-LEAKAGE SUPPRESSION

CROSS-REFERENCE TO RELATED APPLICATIONS

This application hereby claims priority to and incorporates by reference U.S. provisional application no. 63/019,953 filed May 4, 2020.

TECHNICAL FIELD

The disclosure herein relates to signal amplifiers for use in integrated-circuit image sensors and other devices/applications that may benefit from high-fidelity, low-noise signal amplification.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of an active-injection/leakage-suppression capacitive programmable-gain amplifier (PGA) deployed within the column readout path of an integrated-circuit image sensor;

FIG. 2 illustrates exemplary operation of the FIG. 1 PGA in the context of pixel readout;

FIG. 3 illustrates the phase-boundary transition (between precharge and active PGA phases) of the differential PGA reset signal, illustrating a brief channel-discharge interval, between switching on neutralizing transistor X3 and switching off precharge transistors X1 and X2;

DETAILED DESCRIPTION

Figure 4:
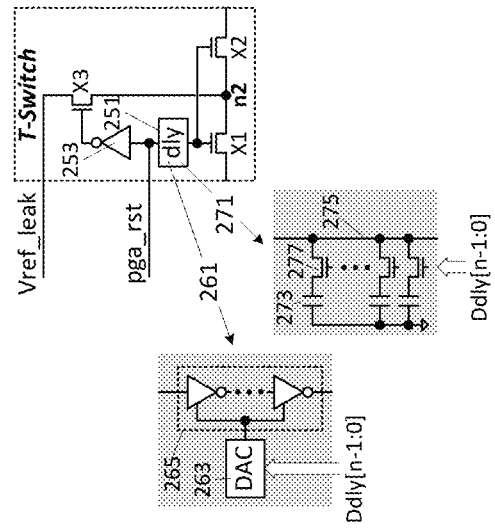
FIGS. 4, 5 and 6 illustrate alternative T-switch embodiments that may be deployed in place of the T-switch shown in FIG. 1.

In various embodiments disclosed herein, charge leakage/injection suppression circuitry within a capacitive programmable gain amplifier provides a low-impedance expulsion path for residual carriers within a feedback-path amplifier-mode switch and equalizes a voltage across a critical-leakage-path component of that amplifier-mode switch, reducing charge injection and leakage into an otherwise isolated amplifier input node to yield a low-noise amplifier output. In a number of embodiments, control signals applied within the leakage/injection-suppression circuitry are precisely timed to effect a brief temporal overlap between switched connection of the residual-carrier expulsion path and activation of the amplifier-mode switch, thus ensuring, at subsequent deactivation of the amplifier-mode switch, that residual carriers within an enhancement or depletion channel of the amplifier-mode switch are expelled via the switched, low-impedance expulsion path instead of being injected into a signal-critical precharge node (ostensibly isolated amplifier input node) between input and feedback capacitors. The control signal timing overlap may be implemented by design and/or effected through run-time or production-time calibrated delay. In those and other embodiments, the voltage at the residual-carrier destination (i.e., low-impedance voltage node to which residual carriers are expelled/conducted) may be run-time or production-time calibrated to compensate for any precharge-mode voltage offset between amplifier inputs and/or otherwise minimize carrier leakage (to the precharge node) during active-mode amplifier operation.

FIG. 1 illustrates an embodiment of an active-leakage/injection-suppression capacitive programmable-gain amplifier 100 ("PGA" for short) deployed within the column readout path of an integrated-circuit image sensor 101. In the depicted example, image sensor 101 includes an array of active pixels, color filter array 105 (overlaid on the illumination surface of pixel array 103—on the backside or frontside of the image sensor die), row controller 107 and column readout circuitry 109. Referring to detail view 115, constituent pixels of array 103 generally include a photodetection element PD (e.g., pinned photodiode), transfer gate TG, floating diffusion node FD, amplifier transistor (SF), read-select transistor (RS) and reset transistor (RST) interconnected to form a 4-transistor (4T) active pixel as shown. The transfer gate, read-select transistor and reset transistor for the pixels in each sensor row are sequentially activated (by like-named control signals generated by row controller 107) to effect pixel signal readout in which (i) each pixel in a RS-selected row drives successive reset-state and image-stage signals (differentially indicative of photocharge accumulated within the photodetection element during a preceding exposure interval) onto a respective column-output line 131 ("Out") to be sampled and digitized by per-column signal processing circuitry 135 within column readout circuit 109, and (ii) row controller 107 enables sequential row-by-row per-column pixel signal output to effect a "rolling-shutter" pixel-array readout. In the specific example shown, each column output line 131 is biased by a constant current source 137 so that, when the read-select transistor for a given pixel is switched on (coupling the source terminal of the in-pixel amplifier transistor SF to the column output line) any voltage change at the gate of transistor SF appears also at the source of that transistor (i.e., so as to maintain a constant gate-to-source voltage according to the current drawn by current source 137) and thus effect a source-follower amplifier. In the NMOS-transistor (N-type MOSFET (metal-oxide-semiconductor field-effect transistor)) pixel embodiment shown, photoelectrons are accumulated within photodetector PD during an exposure interval and then transferred to floating diffusion node FD during readout (i.e., via TG), thus lowering the FD voltage (which is reset to VDD or other pixel reset voltage prior to charge transfer) in proportion to photon flux (luminance intensity) incident upon the photodetector—that is, the output voltage supplied to PGA 100 (and from PGA 100 to analog-to-digital converter 141 (ADC) for pixel output digitization) is negatively proportional to luminance intensity. A positively proportional pixel output may be generated in alternative embodiments (e.g., PMOS pixel implementation or in-pixel amplifier transistor SF configured in a common-source configuration in which the transistor drain drives the column output line) and image sensor 101 and components thereof may generally be changed in various ways—e.g., FD/RST/SF shared among multiple PDs/TGs to reduce effective per-pixel transistor count, multiple readout paths per PD, selective in-pixel charge binning between multiple FDs, transistor-switched capacitance at FD node to effect dynamically selectable conversion gain, etc. In all such image sensor variants (and more generally in any integrated circuit requiring low noise signal amplification), PGA 100 may be deployed to yield high input impedance, low-noise signal amplification with fixed or programmable gain.

Still referring to FIG. 1, PGA 100 includes a differential amplifier 151 having an inverting input (−) coupled via input capacitor Cs to an input signal source (Vin)—i.e., to source-follower-driven column output line 131 in the FIG. 1 image sensor example—and a non-inverting input (+) coupled to a reference voltage, Vref_pga. Feedback capacitor Cf is coupled between the amplifier output (Vout) and the inverting input (node n1) to effect a capacitively-coupled negative-feedback path, and a series-coupled pair of precharge transistors X1 and X2 (NMOS transistors in this example) are coupled in parallel with capacitor Cf (i.e., between Vout and n1). Gates of the precharge transistors are coupled to the true component of a differential reset signal (pga_rst+), and the drains of those transistors (coupled in common to form node n2) are coupled to the source terminal of neutralizing transistor X3. The drain of transistor X3 is coupled to a low-impedance reference voltage supply (Vref_leak) and the gate of transistor X3 is coupled to the complement component of the differential reset signal (i.e., pga_rst−, the complement of pga_rst+).

During image sensor operation, PGA 100 cycles between precharge and active phases in response to cycling of the differential reset signal. More specifically, during the precharge (or reset) phase, pga_rst+ goes high (and pga_rs− goes low) switching on precharge transistors X1 and X2 to conductively couple the amplifier output to non-inverting input node n1 and thereby form a DC-coupled negative feedback path through which amplifier 151 drives n1 to Vref_pga (i.e., drives Vout to ~Vref_pga). By this operation, input capacitor Cs is precharged according to the difference between Vin and Vref_pga, and capacitor Cf is discharged nominally to 0v. Ignoring operation of neutralizing transistor X3 for the moment, when pga_rst+ goes low—effecting transition to the active (gain) phase of the amplifier cycle—transistors X1 and X2 are switched off (i.e., switched to a non-conducting state in which nominally zero current flows between transistor drain and source), isolating node n1 and thus trapping a net charge, go, on capacitors Cs and Cf, where q0=Cs(Vinto−Vref_pga) and t0 is the reset-phase Vin (and with nominally zero charged trapped on Cf). At this point (in the active/gain phase of the PGA cycle), amplifier 151 responds to any change in Vin (i.e., from $Vin_{t0}$ to $Vin_{t1}$) by changing Vout (from $Vout_{t0}$ to $Vout_{t1}$) so as to redistribute charge q0 between Cs and Cf as necessary to maintain node n1 at Vref_pga. That is:

$Cs(Vin_{t0}-Vref\_pga)=q0=Cs(Vin_{t1}-Vref\_pga)+Cf$
$(Vout_{t1}-Vref\_pga)$, so that:

$Vout_{t1}-Vref\_pga=-(Vin_{t1}-Vin_{t0})*Cs/Cf$, or $\Delta Vout=-\Delta Vin*Cs/Cf$, where '*' and '/' denote multiplication and division, respectively. Thus, during active phase operation, PGA 100 operates on a charge-conservation principle (maintaining the charge collectively trapped on capacitors Cs and Cf during the precharge phase during the transition to active phase and then throughout the active phase) to yield a linear output with a signal gain (i.e., due to charge redistribution effected by capacitively-coupled negative feedback path through Cf) negatively proportional to the ratio of the input and feedback capacitances (−Cs/Cf). Accordingly, any charge injected into node n1 in the transition to active phase and any charge leaking through the DC bypass path between Vout and n1 during active phase operation directly degrades the linearity of the amplifier and, to the extent such charge injection/leakage varies from cycle to cycle and/or varies over time due to process-sensitive changes in voltage or temperature, contributes to noise in the amplifier output—in the image sensor context, reducing low-light sensitivity in particular and thus reducing dynamic range.

In the FIG. 1 embodiment, the conventional single-transistor DC-bypass between Vout and inverting-input node n1 is replaced by a multi-transistor "T-switch" 161—named for the upside-down 'T' outlined by constituent transistors X1, X2 and X3—that dramatically reduces both phase-transition charge injection and active-phase charge leakage. Recognizing that residual carriers within a collapsing MOS transistor channel (the primary source of unwanted charge injection at transistor switch-off) generally flow to the lowest-impedance node coupled to that channel, "neutralizing" transistor X3 is switched on at the precharge-phase/active-phase transition slightly before precharge transistors X1/X2 are switched off to provide a low impedance destination (charge-expulsion node) for residual carriers within the X1 channel, thereby significantly reducing (e.g., to a negligible level) charge injection into node n1. Observing further that charge leakage through a MOS transistor is first-order proportional to the voltage across that transistor (i.e., drain-to-source potential), the low impedance charge-expulsion node is driven to or maintained at a "neutralizing" voltage, Vref_leak, that yields a potential at node n2 (i.e., at the common drains of transistors X1 and X2) nominally equal to the potential at node 1 (i.e., neutralizing the X1 drain-to-source voltage such that $V_{n2}-V_{n1}\sim 0$) so that little to no leakage current flows through transistor X1 during active/gain phase of the amplifier cycle.

FIG. 2 illustrates exemplary operation of PGA 100 in the context of the FIG. 1 pixel readout—a readout that yields, via column output line 131, an input voltage (Vin) at PGA 100 that becomes more negative with increased photocharge accumulation/brighter light. At time T1, the differential reset signal goes high (pga_rst+ transitions from low to high, pga_rst− transitions from high to low), switching on precharge transistors X1 and X2 (and switching off neutralizing transistor X3) to drive Vout, via the DC-coupled negative feedback path between the output and inverting input of amplifier 151, to ~Vref_pga. In this "precharge" configuration or mode, differential amplifier 151 charges input capacitor Cs to Vin−Vref_pga as shown at 171. At time T2, pga_rst reverts to its prior state (pga_rst+ going low and pga_rst− going high), switching on neutralizing transistor X3 just prior to switching off precharge transistors X1 and X2 to provide a low-impedance expulsion path for residual carriers within the soon-to-collapse source-to-drain channel of transistor X1 (i.e., as shown at 172) and thereby eliminate/significantly attenuate undesired charge injection into node n1 in the transition from precharge to gain phase (dashed line 180 exemplifying charge-injection artifact avoided by virtue of residual carrier discharge through X3). Transistor X3 remains on (in a conducting state) throughout the PGA gain phase to neutralize the potential across X1 (with Vref_leak nominally equal to Vref_pga). As shown at 173, the neutralized (negligible) potential across X1 ensures negligible leakage through X1 to floating node X1 during gain-phase operation (eliminating/substantially attenuating the charge leakage (exemplified by dashed lines 182) that plagues conventional CPGA implementations) despite the amplified potential across transistor X2.

Referring to FIGS. 1 and 2, the precharge and gain phases operation of PGA 100 may directly implement a correlated double-sampling operation with respect to pixel 115, pre-charging Cs to a reset-state column output during the precharge phase (i.e., driving Vin to a value Vreset corresponding to the reset-state of the pixel FD during the amplifier reset phase so that Cs is Charged to Vreset-Vref_pga) so that, upon pixel image signal generation during the ensuing PGA gain phase (i.e., photocharge transfer from PD to FD yielding column output Vimage), PGA 100 drives Vout to an amplified (multiplied by Cs/Cf) reverse-polarity potential corresponding to the difference between the pixel reset-signal and image-signal outputs. That is Vout=−Vpix*Cs/Cf, where Vpix=Vimage−Vreset. In alternative embodiments, separate amplifier cycles may be executed to generate amplified reset-state and image-state pixel output voltages, with those amplified voltages being differenced (image-state minus reset-state) in the analog or digital domains (i.e., before or after analog-to-digital conversion). Also, while above-unity-gain operation is illustrated in FIG. 2 (i.e., Cs/Cf>1) and variable/programmatically controlled capacitances are shown in FIG. 1 (e.g., banks of two or more metal-insulator-metal, metal-oxide-metal, MOS or other capacitive structures switchably coupled between capacitor terminals in response to programmed setting), unity-gain or below-unity gain (attenuation) amplifiers may be implemented with fixed and/or variable capacitances in alternative embodiments (and optionally with only one rather than both of capacitors Cf and Cs being programmatically sized in the latter case).

FIG. 3 illustrates the phase-boundary transition (between precharge and active PGA phases) of the differential pga_rst signal, illustrating a brief channel-discharge interval, $t_{dchg}$—between switching on neutralizing transistor X3 and switching off precharge transistors X1/X2—effected by asymmetric reset signal swing about the NMOS transistor threshold voltage. More specifically, in an embodiment in which the reset voltage swing is greater than twice the NMOS transistor threshold voltage (i.e., Vt: the gate-to-source voltage, Vgs, at/above which an NMOS transistor switches to a conducting state) and the X3 source voltage is such that the X3 Vgs sits below the midpoint of the reset voltage swing, the rising pga_rst− will yield an X3 Vgs above the NMOS threshold voltage (switching transistor X3 to a conducting state) before pga_rst+ yields an X1/X2 Vgs below the threshold voltage, effecting interval tdchg (shown for example and without limitation to be between 0 and 100 pS) during which X3, X2 and X1 are all on (brief interval of overlap between the conducting states of those transistors). Accordingly, as pga_rst+ falls below the transistor threshold voltage (collapsing/pinching-off the X1 and X2 channels), the charge carriers (residual carriers) that form those channels—and particularly those that form the X1 channel—will be expelled toward the low impedance path established by the Vref_leak voltage source (i.e., through transistor X3). In a number of embodiments the discharge interval is implemented by design to be brief enough (or even zero) to avoid disturbing the precharged state of Cs (e.g., $t_{dchg} \leq K^*\tau$, where 'τ' is the RC time constant for charging Cs and K is a predetermined fraction thereof −0.5, 0.1, 0.01, etc.). In other embodiments, the discharge interval is programmatically adjustable to enable iterative determination/calibration of optimal time between switching transistor X3 on and switching transistors X1/X2 off.

FIG. 4 illustrates alternative T-switch embodiment that may be deployed in place of T-switch 161 within the FIG. 1 PGA. As shown, neutralizing transistor X4 (shown as X3 in FIGS. 1 and 3) is implemented by a PMOS (p-type MOS) transistor and thus switched on in response to the falling edge of an active-high reset signal ("pga_rst"). More specifically, as shown in diagram 221, X3 is switched on as the falling pga_rst yields an X4 Vgs below the PMOS threshold voltage and thus prior to switching off transistors X1 and X2 at the yet-lower NMOS threshold voltage, thereby establishing a by-design discharge interval ($t_{dchg}$) as shown.

Figure 5:
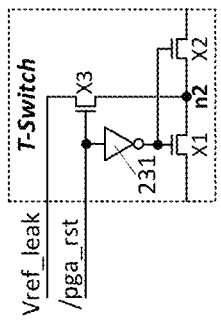
Figure 6:
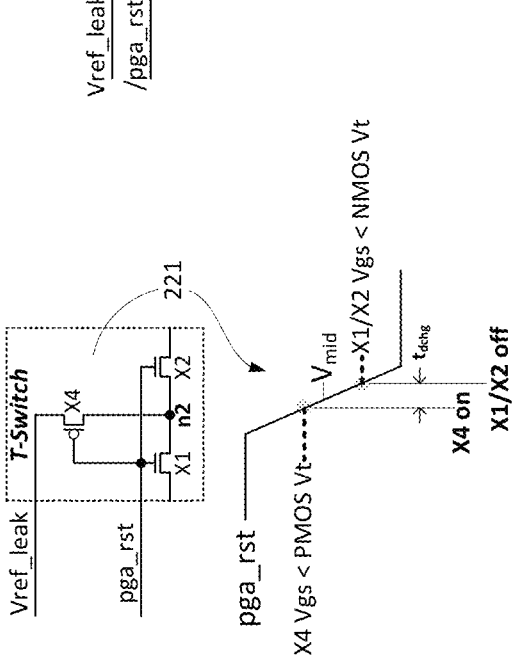

In the FIGS. 1 and 4 embodiments, the relative switch-on times of transistors X3 and X4 during reset-signal transition are dependent on their respective source voltages (e.g., Vn2 and Vref_leak, respectively) so that, in applications where those source voltages are relatively low/high, the X3/X4 switch-on point may occur later than desired. FIGS. 5 and 6 illustrate alternative T-switch embodiments that may be deployed in place of the FIG. 1 T-switch to implement discharge intervals independently (at least in part) of the Vref_leak and Vn2 potentials. In the FIG. 5 implementation, a single-ended active-low reset signal ("/pga_rst") is supplied to the gate of neutralizing transistor X3 and, after inversion within inverter 231, to the gates of transistors X1 and X2. By this arrangement, a rising/pga_rst edge will switch on transistor X3 at the start of a discharge interval (i.e., at the transition between precharge and gain phases of the PGA), with the output of inverter 221 going low one gate-delay later (i.e., time required for the NMOS transistor within a CMOS implementation of inverter 221 to switch on), thus ensuring a nonzero discharge interval ($t_{dchg}$). FIG. 6 illustrates a T-switch embodiment having a programmable delay cell 251 disposed between the reset signal input (pga_rst) and gates of transistors X1/X2 to enable run-time or production-time adjustable delay between the falling edge of pga_rst and X1/X2 shut off. Inverter 253 produces the complement reset signal (switching on X3 in response to the falling edge of pga_rst and thus shortly before, concurrently with or possibly even after X1/X2 switch-off). In alternative embodiments, true and complement components of a differential reset signal may be supplied to delay cell 251 and the gate of transistor X3, respectively—or an active-low pga_reset signal may be supplied directly to the X3 gate and to an inverting implementation of the delay cell 251. The delay cell itself may implemented in a number of ways including, for example and without limitation: a current-starved inverter chain as shown at 261 (e.g., with n-bit delay value, Ddly[n-1:0] converted (via digital-to-analog converter 263 (DAC)) to one or more analog signals for scaling inverter supply voltage(s) and thus enabling run-time or production-time adjustment of propagation delay through individual inverter(s) in inverter chain 265); or a switched capacitive loading as shown at 271 (switchably coupling a programmable number of capacitive elements 273 to delay line 275 via transistor switches 277 in response to Ddly[n-1:0]); or programmably selecting an inverter chain length, or any practicable combination of those approaches and/or any other practicable manner of implementing a programmable delay.

Figure 7:
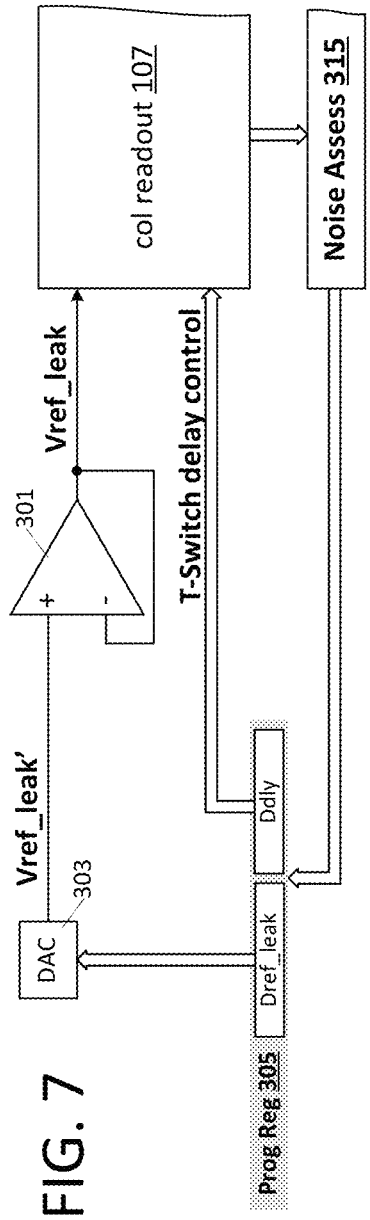
FIG. 7 illustrates an exemplary PGA calibration loop that enables run-time or production-time calibration of reference voltage Vref_leak and/or any digital delay control value supplied to the various active-leakage/injection-suppression PGA embodiments disclosed herein.

FIG. 7 illustrates an exemplary PGA calibration loop that enables run-time or production-time calibration (optimization) of the neutralizing voltage (Vref_leak) and/or any digital delay control value (Ddly[n-1:0]) supplied to the various active-injection/leakage-suppression PGA embodiments discussed above. In the depicted example, follower-configured amplifier 301 generates a regulated Vref_leak output (steady-state voltage despite time-varying current flow, thus forming low impedance path for carriers expelled from transistor X1 at switchover between PGA precharge and active phases) in response to reference voltage Vref_leak', the latter generated by DAC 303 in response to digital control value Dref_leak. Dref_leak and the above-described delay-cell control value (Ddly) are stored in one or more volatile or non-volatile programmable registers 305 accessible by on-die or external noise assessment circuitry. In one embodiment, a sequence of pixel array readouts are executed with respect to a steady-state objective scene (e.g., a dark or blacked-out and/or bright or whited-out scene) to deliver a sequence of nominally identical images (via column readout circuitry 107) to noise-assessment engine 315. Noise assessment engine assesses noise level within each image sequence (e.g., determining a statistical measure of image variance) over a range of Dref_leak and Ddly values, for example, independently sweeping each of those values through its programmable range (either before the other) to assess a noise level for each digital setting and thereby identify a nominally optimal (lowest noise) setting for each value.

The various pixel circuit architectures and layouts, imaging circuit architectures, color filter arrays, micro-lens arrays, neutralizing-voltage programming, T-switch delay programming, readout methodology, etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits and architectures. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific time intervals, transistor types, signal polarities, transistor types (PMOS vs. NMOS), quantities/types of photodetection elements, photocarrier polarity, and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational parameters (neutralizing voltage applied to CPGA T-switches, digital delay supplied to T-switches, etc.) or any other configurable parameters may be achieved, for example and without limitation, by loading a control value into a register or other storage circuit within above-described integrated circuit devices in response to a host instruction and/or on-board processor or controller (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit comprising:
    a first signal conductor;
    first and second reference-voltage conductors;
    a differential amplifier having a second input coupled to the first reference-voltage conductor, a first input and an output;
    a first capacitive element coupled between the output and the first input of the differential amplifier;
    a second capacitive coupled between the first signal conductor and the first input of the differential amplifier;
    a first switching element coupled between the first input of the differential amplifier and an interconnect node;
    a second switching element coupled between the output of the differential amplifier and the interconnect node; and
    a third switching element coupled between the second reference-voltage conductor and the interconnect node.

2. The integrated circuit of claim 1 wherein at least one of the first and second capacitive elements comprises switching elements to enable adjustment of its capacitance value.

3. The integrated circuit of claim 1 wherein the first, second, and third switching elements comprise first, second and third metal-oxide-semiconductor field-effect (MOSFET) transistors.

4. The integrated circuit of claim 1 further comprising a second signal conductor to convey a control signal that cycles between first and second control voltage levels, and wherein the first and second switching elements are switched to a conducting state in response to transition of the control signal to the first control voltage level and switched to a non-conducting state in response to transition of the control signal to the second control voltage level.

5. The integrated circuit of claim 1 wherein the third switching element is switched to a non-conducting state in response to transition of the control signal to the first control voltage level and to a conducting state in response to transition of the control signal to the second control voltage level.

6. The integrated circuit of claim 5 wherein, upon transition of the control signal to the second control voltage level, the third switching element switches to the conducting state shortly before the first switching element switches to the non-conducting state such that the first and third switching elements are concurrently in the conducting state for a brief interval following transition of the control signal to the second control voltage level.

7. The integrated circuit of claim 6 further comprising delay circuitry coupled between the second signal conductor and the first switching element to delay transition of the first switching element from the conducting state to the non-conducting state in response to transition of the control signal to the second control voltage level.

8. The integrated circuit of claim 7 wherein the delay circuitry comprises one or more delay elements through which the control signal propagates to reach the first switching element.

9. The integrated circuit of claim 8 further comprising circuitry to adjust a propagation delay through the delay circuitry to adjust duration of the brief interval.

10. The integrated circuit of claim 9 wherein the circuitry to adjust the propagation delay through the delay circuitry comprises circuitry to iteratively adjust the propagation delay based at least in part on voltages generated at the output of the differential amplifier over multiple cycles of the control signal.

11. The integrated circuit of claim 10 further comprising a programmable register to store a digital control value that controls the propagation delay through the delay circuitry and wherein the circuitry to iteratively adjust the propagation delay comprises circuitry to iteratively adjust the digital control value.

12. The integrated circuit of claim 1 further comprising circuitry to iteratively adjust a reference voltage conveyed via the second reference-voltage conductor.

13. The integrated circuit of claim 12 wherein the circuitry to iteratively adjust the reference voltage conveyed via the second reference-voltage conductor comprises circuitry to iteratively adjust the reference voltage based at least in part on voltages generated at the output of the differential amplifier over multiple cycles of the control signal.

14. A method of operation within an integrated circuit component having a differential amplifier, a first capacitive element coupled between an output of the differential amplifier and a first input of the differential amplifier, and a second capacitive element coupled between a first signal conductor and the first input of the differential amplifier, the method comprising:
    supplying a first reference voltage to a second input of the differential amplifier;
    cycling a control signal between first and second control voltage levels;
    alternately coupling and decoupling the first input of the differential amplifier to and from an interconnect node in response to respective, successive transitions of a control signal to first and second control voltage levels;
    alternately coupling and decoupling the output of the differential amplifier to and from the interconnect node in response to the respective, successive transitions of the control signal to the first and second control voltage levels;
    decoupling the interconnect node from a second reference voltage in response to the transition of the control signal to the first control voltage level; and
    coupling the interconnect node to the second reference voltage in response to the transition of the control signal to the second control voltage level.

15. The method of claim 14 wherein alternately coupling and decoupling the first input of the differential amplifier to and from an interconnect node in response to respective, successive transitions of a control signal to first and second control voltage levels comprises switching a metal-oxide-semiconductor field-effect (MOSFET) transistor to a conducting state in response to transition of the control signal to the first control voltage level and switching the MOSFET transistor to a non-conducting state in response to transition of the control signal to the second control voltage level.

16. The method of claim 14 wherein alternately coupling and decoupling the first input of the differential amplifier to and from the interconnect node in response to the respective, successive transitions of the control signal to first and second control voltage levels and coupling the interconnect node to the second reference voltage in response to the transition of the control signal to the second control voltage level comprises, at each transition of the control signal to the second control voltage level, coupling the interconnect node to the second reference voltage shortly prior to decoupling the first input of the differential amplifier from the interconnect node such that the interconnect node is concurrently coupled to both the second reference voltage and the first input of the differential amplifier for a brief interval at each transition of the control signal to the second control voltage level.

17. The method of claim 16 wherein coupling the interconnect node to the second reference voltage shortly prior to decoupling the first input of the differential amplifier from the interconnect node comprises delaying propagation of the control signal to a switching element coupled between the first input of the differential amplifier and the interconnect node.

18. The method of claim 17 further comprising adjusting a propagation time interval by which propagation of the control signal to the switching element is delayed to adjust the brief interval.

19. The method of claim 18 wherein adjusting the propagation time interval comprises iteratively adjusting the propagation delay based at least in part on voltages generated at the output of the differential amplifier over multiple cycles of the control signal.

20. The method of claim 19 wherein iteratively adjusting the propagation time interval comprises iteratively adjusting a digital control value that controls the propagation time interval, the method further comprising storing the digital control value within a programmable register of the integrated circuit component.

21. The method of claim 14 further comprising iteratively adjusting the second reference voltage based at least in part on voltages generated at the output of the differential amplifier over multiple cycles of the control signal.

22. An integrated circuit component comprising:
    a first signal conductor;
    a differential amplifier;
    a first capacitive element coupled between an output of the differential amplifier and a first input of the differential amplifier;

a second capacitive element coupled between the first signal conductor and the first input of the differential amplifier;

means for supplying a first reference voltage to a second input of the differential amplifier;

means for cycling a control signal between first and second control voltage levels;

means for alternately coupling and decoupling the first input of the differential amplifier to and from an interconnect node in response to respective, successive transitions of a control signal to first and second control voltage levels;

means for alternately coupling and decoupling the output of the differential amplifier to and from the interconnect node in response to the respective, successive transitions of the control signal to the first and second control voltage levels; and means for decoupling the interconnect node from a second reference voltage in response to the transition of the control signal to the first control voltage level, and for coupling the interconnect node to the second reference voltage in response to the transition of the control signal to the second control voltage level.

* * * * *